(12) United States Patent
Murphy et al.

(10) Patent No.: US 10,349,564 B2
(45) Date of Patent: Jul. 9, 2019

(54) SLIDE ACCESS ENCLOSURE

(71) Applicant: Atlantic Health System, Inc., Morristown, NJ (US)

(72) Inventors: Austin C. Murphy, Upper Montclair, NJ (US); Robert Peake, Rumson, NJ (US)

(73) Assignee: Atlantic Health System, Inc., Morristown, NJ (US)

( * ) Notice: Subject to any disclaimer, the term of this patent is extended or adjusted under 35 U.S.C. 154(b) by 0 days.

(21) Appl. No.: 15/669,386

(22) Filed: Aug. 4, 2017

(65) Prior Publication Data

US 2018/0042146 A1 Feb. 8, 2018

Related U.S. Application Data

(60) Provisional application No. 62/371,303, filed on Aug. 5, 2016.

(51) Int. Cl.
| | | |
|---|---|---|
| *H05K 9/00* | (2006.01) | |
| *H05K 7/18* | (2006.01) | |
| *H05K 5/02* | (2006.01) | |
| *H05K 5/00* | (2006.01) | |
| *H05K 7/14* | (2006.01) | |

(52) U.S. Cl.
CPC .......... *H05K 9/002* (2013.01); *H05K 5/0004* (2013.01); *H05K 5/0204* (2013.01); *H05K 5/0221* (2013.01); *H05K 7/1411* (2013.01); *H05K 7/183* (2013.01); *H05K 9/0007* (2013.01); *H05K 9/0062* (2013.01); *H05K 9/0088* (2013.01)

(58) Field of Classification Search
CPC ............... H05K 9/002; H05K 9/0007; H05K 2201/10371; H05K 2201/0707; H05K 7/183; H05K 7/1411; H05K 5/0204; H05K 5/0004; H05K 9/0062; H05K 5/0221; H05K 9/0088
USPC ......................... 361/724–727, 800, 816, 818
See application file for complete search history.

(56) References Cited

U.S. PATENT DOCUMENTS

| | | |
|---|---|---|
| 5,108,063 A | 4/1992 | Koerber, Sr. et al. |
| 5,571,256 A | 11/1996 | Good et al. |
| 5,783,771 A * | 7/1998 | Copeland ............ H05K 9/0073 174/365 |
| 5,902,025 A | 5/1999 | Yu |

(Continued)

*Primary Examiner* — Steven T Sawyer
*Assistant Examiner* — Sagar Shrestha
(74) *Attorney, Agent, or Firm* — The McHattie Law Firm; Jonathan A. Tyler

(57) ABSTRACT

An apparatus includes a structure having a plurality of first sides and a second side detachably joined to the plurality of first sides. The plurality of first sides define a volume, wherein the second side has a closed position in which the second side is joined to the plurality of first sides and an open position in which the side is detached from the plurality of sides, the plurality of first sides comprising a first material having electromagnetic interference (EMI) shielding properties, the second side comprising a second material having EMI shielding properties. The apparatus also includes a movable chassis adapted to move between a first chassis position in which the chassis is entirely within the volume and a second chassis position in which at least a portion of the chassis is outside the volume, the chassis being adapted to hold an electronic device.

15 Claims, 12 Drawing Sheets

(56) References Cited

U.S. PATENT DOCUMENTS

| | | | |
|---|---|---|---|
| 6,246,573 B1 * | 6/2001 | Khan | G06F 1/16 312/223.2 |
| 6,259,605 B1 | 7/2001 | Schmitt | |
| 7,379,298 B2 | 5/2008 | Walsh et al. | |
| 2003/0193781 A1 * | 10/2003 | Mori | H05K 7/1489 361/725 |
| 2011/0110026 A1 * | 5/2011 | Goza | H05K 5/0021 361/679.6 |

* cited by examiner

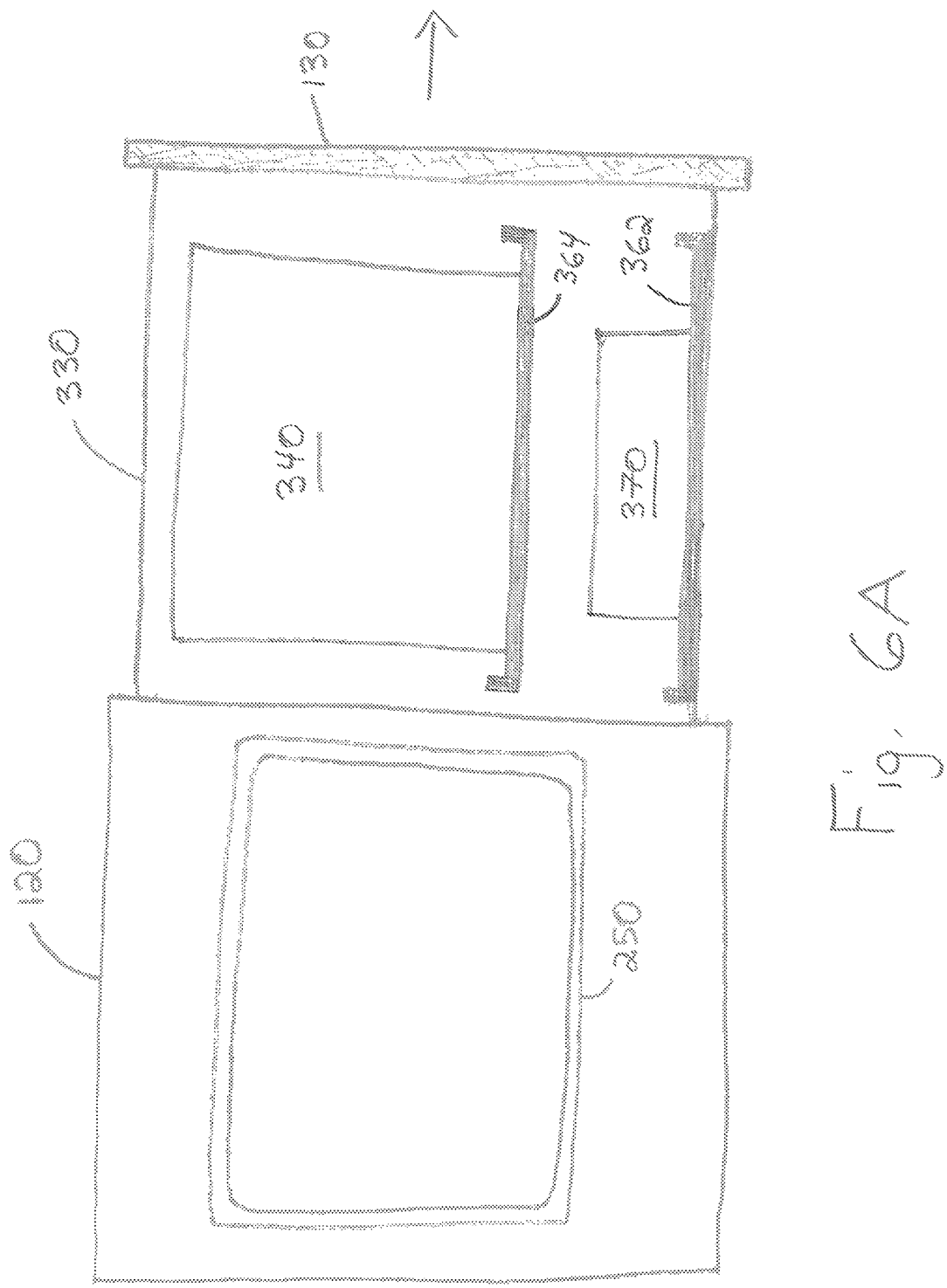

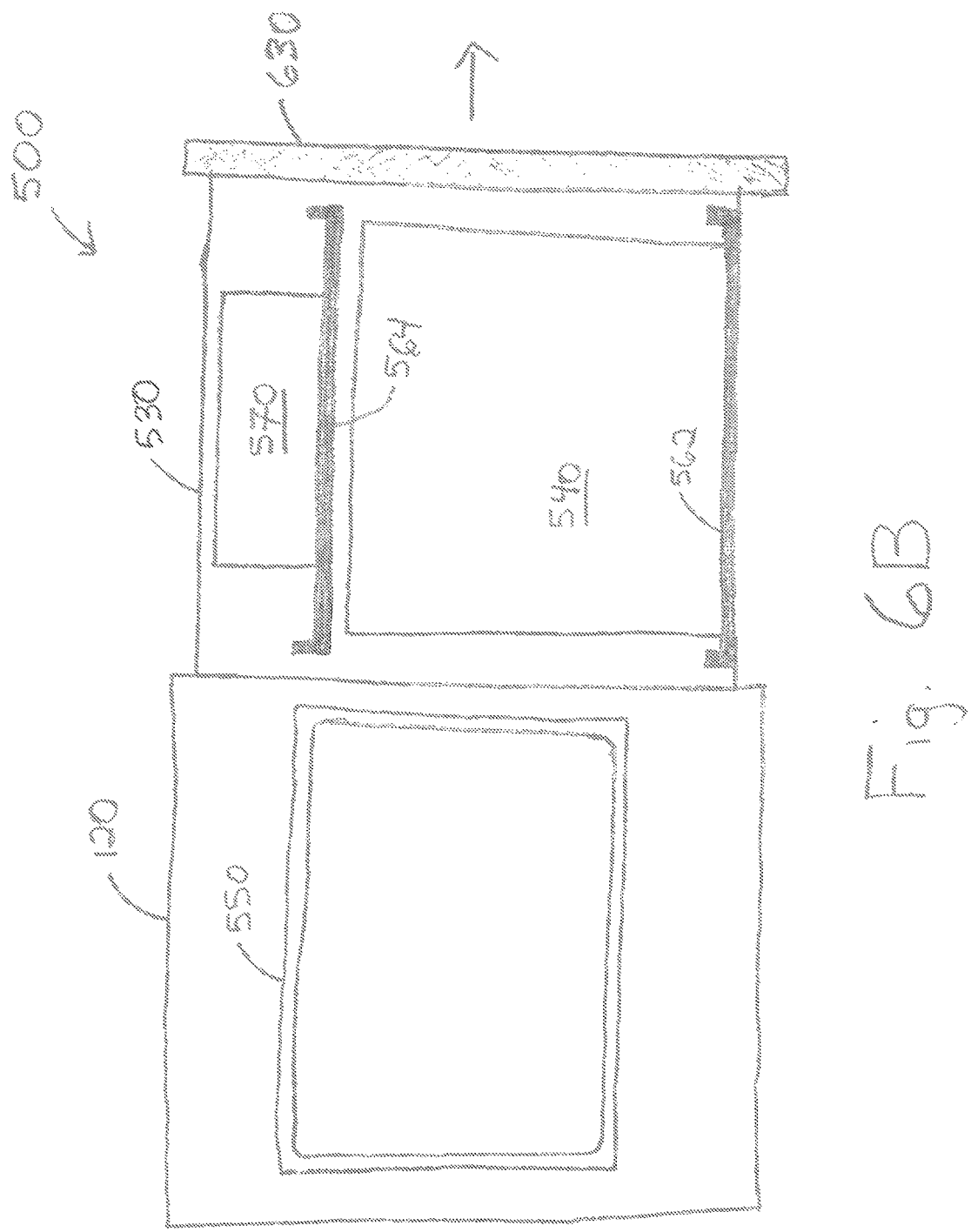

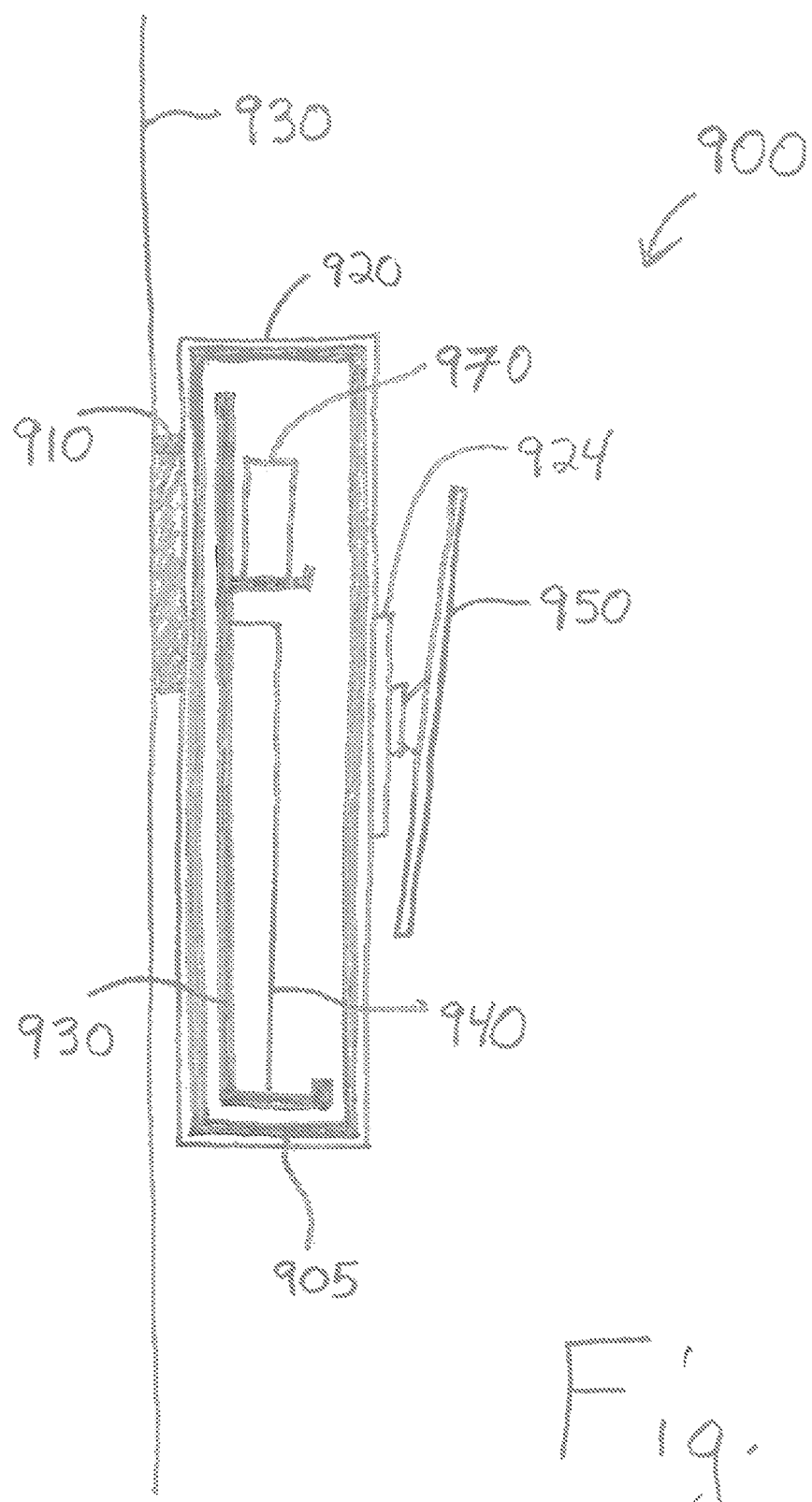

SLIDE ACCESS ENCLOSURE

This application claims the benefit of U.S. Provisional Patent Application No. 62/371,303, filed Aug. 5, 2016, which is incorporated by reference herein in its entirety and for all purposes.

TECHNICAL FIELD

This specification relates generally to systems, apparatus and methods for housing electronic devices, and more particularly to slide access enclosures, and other systems, apparatus, and methods for housing electronic devices in proximity to patients within a hospital or other patient care facility.

BACKGROUND

Data processing units and systems, referred to herein broadly as electronics, have become a fixture in almost all hospitals or other patient care facilities, specifically in patient rooms, for the entry and retrieval of electronic information relating to an individual patient's care, treatment and/or current condition. In addition, with the rapid adoption of telepresence video conferencing technology as a part of patient care, electronics relating to said conferencing systems are also now common in patient rooms. As such, it is common for various disparate electronic systems to be installed and/or integrated into patient rooms.

The installation and/or mounting of electronics in hospital and other patient care rooms is often problematic. Due to the limited space found in most hospital and other patient care rooms, electronics must be mounted and/or installed in close proximity to the patient and to other sensitive medical equipment. The hospital or patient care facility has a responsibility to ensure that the installed and/or mounted electronics pose no risk to patients and that such electronics do not interfere with other items or with any sensitive medical equipment located in the hospital or patient care room(s).

Due to these risks, electronics used in close proximity to a patient, heretofore, must be certified as safe for the "patient-care vicinity" or otherwise certified as "medical grade" electronics. Medical grade electronics must meet certain certification standards published and/or maintained by organizations that include, without limitation, the International Electrotechnical Commission (IEC), the American National Standards Institute (ANSI), and the Association for the Advancement of Medical Instrumentation (AAMI). Some of the relevant standards include, without limitation, IEC 60601-1, UL-2601-1, and ANSI/AAMI ES 6060101, which set general standards for electrical shock risk, electromagnetic compatibility, electromagnetic interference ("EMI"), mechanical hazards and ignition hazards. Generally, any piece of electronics in close proximity to a patient must meet at least the certification standards set forth in IEC 60601-1, UL 2601-1 and/or ANSI/AAMI ES 60601-1, Failure by a hospital or other patient care facility to use medical grade electronics in a patient's proximity may create a safety risk and can lead to fines and/or loss of accreditation.

Medical grade electronics are generally more expensive than typical "consumer grade" electronics, which do not meet the aforementioned certification standards. Due to this fact, hospitals and other patient care facilities are forced to expend large sums of money to purchase medical grade electronics for use in patient care. In addition, due in part to the lengthy certification process that medical grade electronics are required to undergo, the hardware and/or software of medical grade electronics is often outdated as compared to consumer grade electronics. Thus, in terms of computing performance, consumer grade electronics are often superior to more expensive medical grade electronics.

Moreover, due to the small size of many hospital and other patient care rooms, medical equipment, including electronics, must often be wall mounted to conserve space. Wall mounting of electronics is often achieved via the housing of the subject electronics in an enclosure. While wall mounting electronics in an enclosure can save valuable floor space, it creates additional challenges such as how to create mounting means and how to provide for accessibility to the housed electronics for repair. In addition, it is not always desirable that the wall mounting of electronics be permanent. Instead, a removable wall mount enclosure may be necessary or desirable.

Therefore, a need exists for an enclosure that can be placed in a patient room at a hospital or other patient care facility, that can hold a selected consumer grade electronics device, and which shields a patient and any electronic or mechanical devices in the patient room from the external risks associated with the consumer grade electronics device. Specifically, there is a need for such an enclosure constructed to ensure that when a consumer grade electronics device is housed therein, the enclosure meets all applicable safety certifications and standards for use of electronic devices in close proximity to a patient. There is a further need for such an enclosure to be mountable on a wall of a patient's room. In addition, a need further exists for an enclosure to provide ready access to the housed electronic device without the need to demount or disassemble the enclosure.

SUMMARY

In accordance with an embodiment, an apparatus includes a structure having a plurality of first sides and a second side detachably joined to the plurality of first sides. The plurality of first sides define a volume, wherein the second side has a closed position in which the second side is joined to the plurality of first sides, and an open position in which the side is detached from the plurality of sides, the plurality of first sides comprising a first material having electromagnetic interference (EMI) shielding properties, the second side comprising a second material having EMI shielding properties. The apparatus also includes a movable chassis adapted to move between a first chassis position in which the chassis is entirely within the volume and a second chassis position in which at least a portion of the chassis is outside the volume, the chassis being adapted to hold an electronic device.

In one embodiment, the apparatus also includes a track disposed within the structure. The chassis is disposed in the track and moves along the track between the first chassis position and the second chassis position.

In another embodiment, the first material is one of: a sheet metal, a metal screen, a metal foam, a coating of metallic ink, a copper-based radio frequency (RF) shielding material, a copper foil, an aluminum sheeting, a conductive mesh, and one or more magnets. The second material is one of: a sheet metal, a metal screen, a metal foam, a coating of metallic ink, a copper-based RF shielding material, a copper foil, an aluminum sheeting, a conductive mesh, and one or more magnets. In another embodiment, the first material and the second material are the same.

In another embodiment, the electronic device is accessible to a user when the movable chassis is in the second chassis position.

In another embodiment, the second side includes a locking mechanism adapted to lock the second side in the closed position.

In another embodiment, the plurality of first sides comprise a first layer forming an outer enclosure and a second layer disposed on an interior of the outer enclosure, the second layer comprising one of: a sheet metal, a metal screen, a metal foam, a coating of metallic ink, a copper-based RF shielding material, a copper foil, an aluminum sheeting, a conductive mesh, and one or more magnets.

In accordance with another embodiment, a system includes a structure having a volume located inside the structure, wherein the structure comprises a layer formed of a material having EMI shielding properties. The system also includes a movable support having a first position in which the movable support is located within the volume and a second position in which at least a portion of the movable support is located outside the volume, and an electronic device disposed on the movable support, wherein the electronic device is located within the volume when the movable support is in the first position and at least part of the electronic device is located outside the volume when the movable support is in the second position. The structure is adapted to be mounted on a wall.

In one embodiment, the structure is adapted to provide EMI shielding to people and objects proximate the structure by blocking electromagnetic frequencies emitted by the electronic device.

In another embodiment, the movable support comprises a track and a chassis adapted to slide on the track.

In another embodiment, the material is one of: a sheet metal, a metal screen, a metal foam, a coating of metallic ink, a copper-based RF shielding material, a copper foil, an aluminum sheeting, a conductive mesh, and one or more magnets.

In another embodiment, the structure includes a first layer of a first material that does not have EMI shielding properties, and a second layer of a second material having EMI shielding properties.

In another embodiment, the structure includes a plurality of first sides that define the volume, and a second side attached to the movable support, the second side being adapted to move between a closed position in which the plurality of first sides and the second side define boundaries of the volume and an open position in which the second side is not connected to the plurality of first sides.

In accordance with another embodiment, an enclosure having a layer of an EMI shielding material is placed in a hospital room or in a room in a patient care facility. A consumer grade electronic device is placed in the enclosure. The consumer grade electronic device is operated in the hospital room. For example, the consumer grade electronic device is powered on and used for its ordinary purpose. Advantageously, the enclosure qualifies as a medical grade electronic device while the consumer grade electronic device is operating therein.

These and other advantages of the present disclosure will be apparent to those of ordinary skill in the art by reference to the following Detailed Description and the accompanying drawings.

BRIEF DESCRIPTION OF THE DRAWINGS

FIG. 6A shows the wall mountable enclosure of the embodiment of FIG. 1 in an open position;

FIG. 6B shows the wall mountable enclosure of the embodiment of FIG. 5 in an open position;

FIG. 9 shows a cross-section of a wall mountable enclosure mounted to a wall in accordance with another embodiment.

DETAILED DESCRIPTION

In accordance with an embodiment, an apparatus includes a structure having a plurality of first sides and a second side detachably joined to the plurality of first sides. The plurality of first sides define an enclosed volume. The second side has a closed position in which the second side is joined to the plurality of first sides, and an open position in which the side is detached from the plurality of sides. The plurality of first sides are formed of a material having electromagnetic interference (EMI) shielding properties, such as sheet metal, a metal screen, a metal foam, a coating of metallic ink, a copper-based radio frequency (RF) shielding material, copper foil, aluminum sheeting, a conductive mesh, or one or more magnets. The second side is also formed of a material having EMI shielding properties. The apparatus also includes a movable chassis adapted to move between a first chassis position in which the chassis is entirely within the volume, and a second chassis position in which at least a portion of the chassis is outside the volume. The chassis is adapted to hold an electronic device.

The apparatus includes a track disposed within the structure. The chassis is disposed in the track and moves along the track between the first chassis position and the second chassis position. The electronic device is accessible to a user when the movable chassis is in the second chassis position.

Advantageously, the apparatus disclosed herein is adapted to be mounted in a patient room in a hospital or other patient care facility. For example, the apparatus may be mounted on a wall in a patient room. Also advantageously, the apparatus is adapted to hold a consumer grade electronics device and to shield a patient in the room, and any electronic or mechanical devices in the room, from external risks associated with the consumer grade electronics device. Specifically, the apparatus is constructed to ensure that when a consumer grade electronics device is housed therein, the apparatus meets all applicable safety certifications and standards for use in close proximity to a patient.

For example, in certain embodiments the enclosure is constructed to ensure that when a consumer grade electronic device is housed therein, the enclosure meets all relevant standards including, for example, certification standards published and/or maintained by such organizations as the International Electrotechnical Commission (IEC), the American National Standards Institute (ANSI), and the Association for the Advancement of Medical Instrumentation (AAMI). More specifically, the enclosure may be constructed to ensure that when a consumer grade electronic device is housed therein, the enclosure meets IEC 60601-1, UL-2601-1, and ANSI/AAMI ES 6060101, and/or any other applicable standard.

Figure 1:
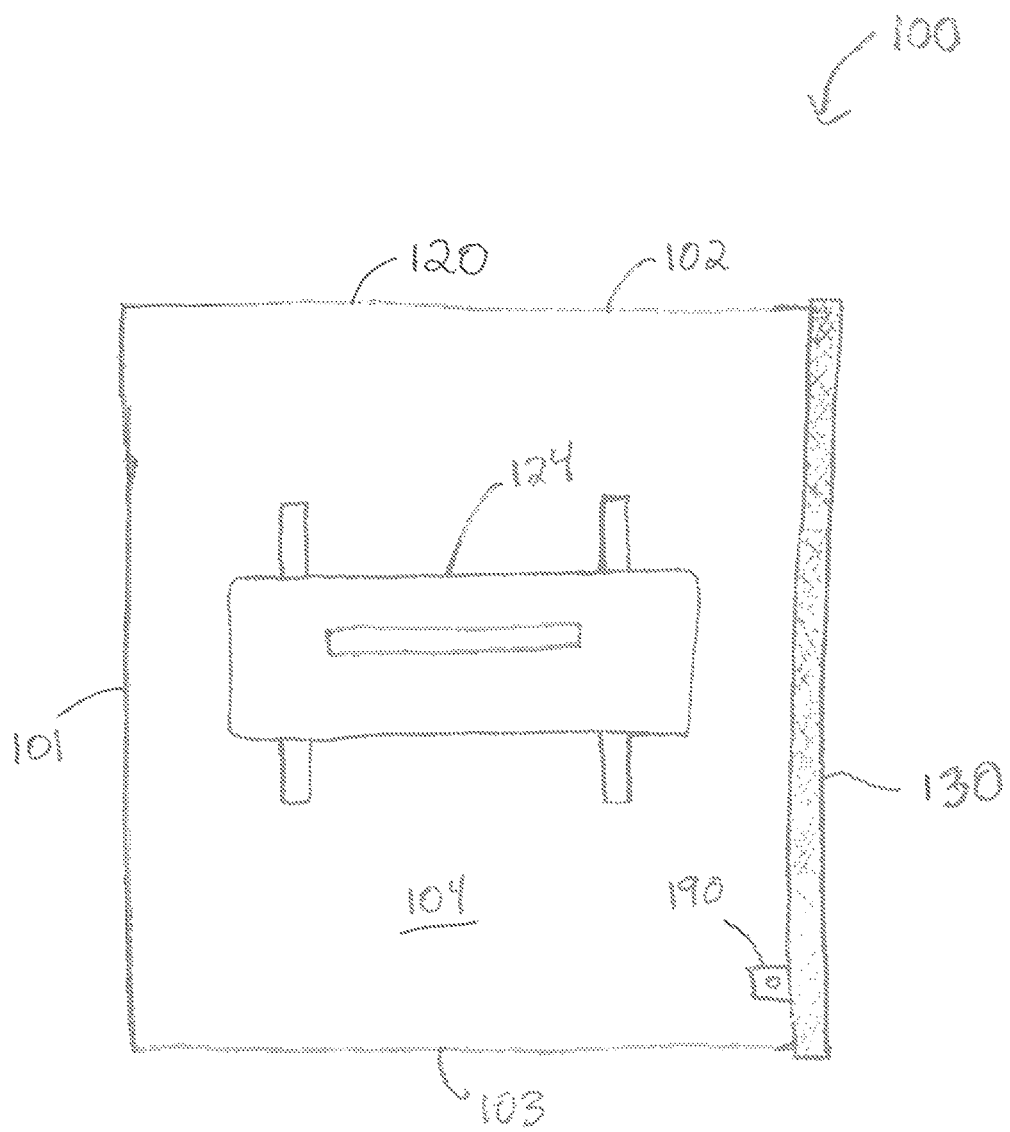
FIG. 1 shows a front view of a wall mountable enclosure in accordance with an embodiment.

FIG. 1 shows a front view of a wall mountable enclosure in accordance with an embodiment. Wall mountable enclosure 100 includes an outer enclosure 120. Outer enclosure 120 comprises a material which shields the external environment (including any nearby patients) from risks associated with consumer grade electronics such as electromagnetic interference (EMI), as well as mechanical hazards, electrical case leakage and ignition hazards. The shape of outer enclosure 120 may be a rectangular prism, a cube, or another shape. Outer enclosure 120 includes a plurality of sides. In the illustrative embodiment of FIG. 1, outer enclosure 120 includes a left side 101, a top side 102, a bottom side 103, and a front side 104. Outer enclosure 120 also includes a back side (shown as back side 306 in FIG. 3, for example), which, together with sides 101, 102, 103, 104, define an internal volume (also shown in FIG. 3 as volume 391). Outer enclosure 120 also includes a detachable right side 130, which has a closed position (shown in FIG. 1, for example) and a detached position (shown in FIG. 6A, for example).

Outer enclosure 120 may be formed of any suitable EMI shielding material known in the art. For example, sides 101, 102, 103, 104, and the back side 306 of outer enclosure 120 may be formed of sheet metal, metal screen, metal foam, a coating of metallic ink, copper radio frequency (RF) shielding, copper foil, aluminum sheeting, conductive mesh, one or more magnets, etc. Other materials may be used. Detachable side 130 may also be formed of sheet metal, metal screen, metal foam, a coating of metallic ink, copper radio frequency (RF) shielding, copper foil, aluminum sheeting, conductive mesh, one or more magnets, etc. In one embodiment, outer enclosure 120 comprises a substantially closed metal container. In other embodiments, outer enclosure 120 may include one or more cutouts having sizes and shapes selected based, for example, on the wavelengths of electromagnetic radiation which the electronics housed within the outer enclosure 120 are expected to emit, and/or the wavelengths to which the wall mountable enclosure 100 is expected to be exposed. For example, a cutout may be a hole having a diameter smaller than the wavelength(s) which the electronics housed within outer enclosure 120 are expected to emit, and/or smaller than the wavelengths to which the wall mountable enclosure is expected to be exposed. In one embodiment, a material having EMI shielding properties (such as a metal screen) may be disposed over the cutout(s).

The shielding properties of wall mountable enclosure 100 reduce or eliminate EMI or otherwise limit the electromagnetic emissions of the housed electronics such that the enclosure meets all certification standards for medical grade electronics when consumer grade electronics are housed within the wall mountable enclosure. For example, wall mountable enclosure 100 may be adapted to ensure that when a consumer grade electronic device is housed therein, the enclosure meets IEC 60601-1, UL-2601-1, and ANSI/AAMI ES 6060101, and/or any other applicable standard.

Figure 2:
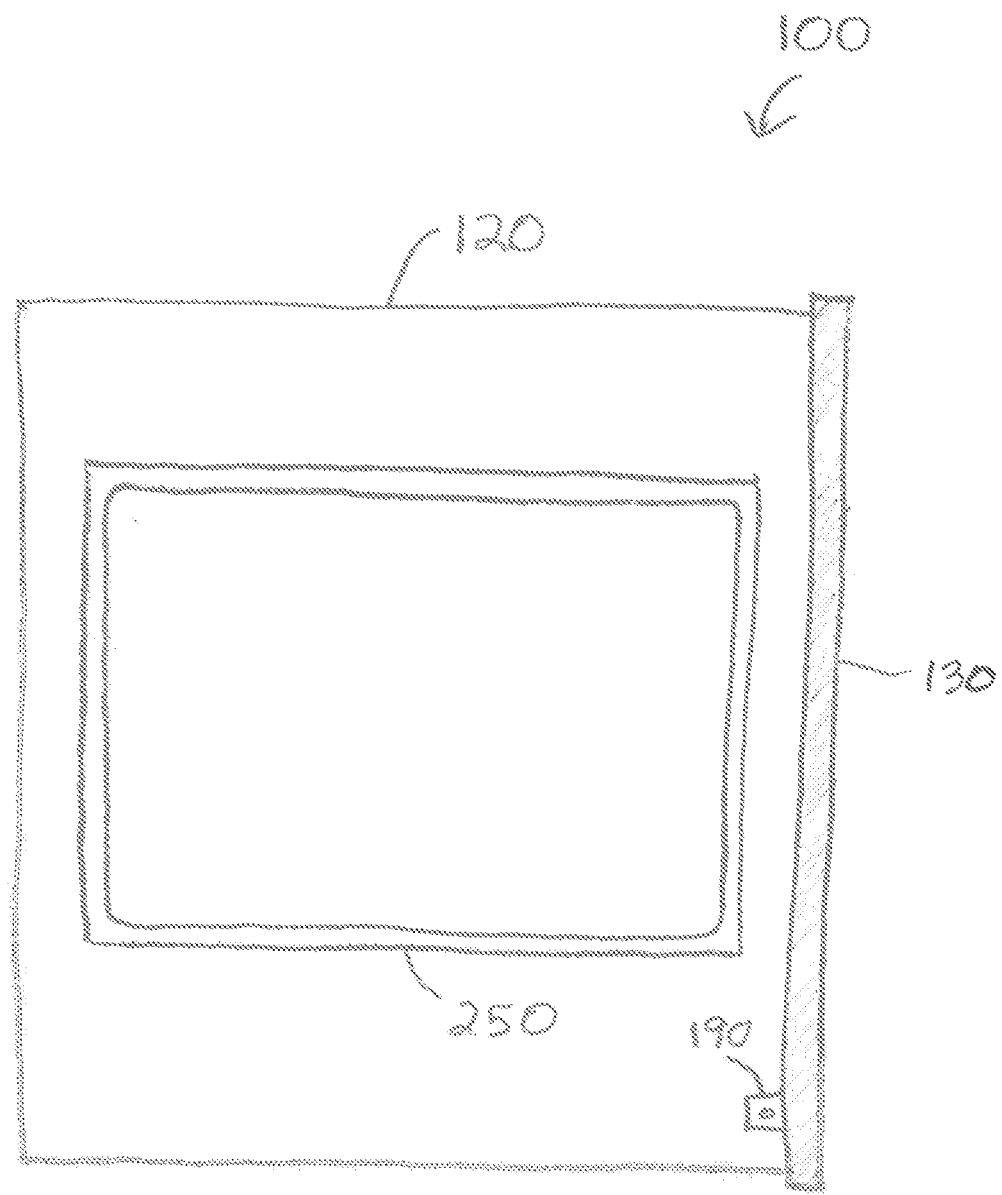
FIG. 2 shows a wall mountable enclosure and a video screen in accordance with an embodiment.

In one embodiment, a video screen or other electronic device may be mounted on outer enclosure 120. FIG. 2 shows wall mountable enclosure 100 with a video screen 250 mounted on outer enclosure 120 in accordance with an embodiment.

Figure 3:
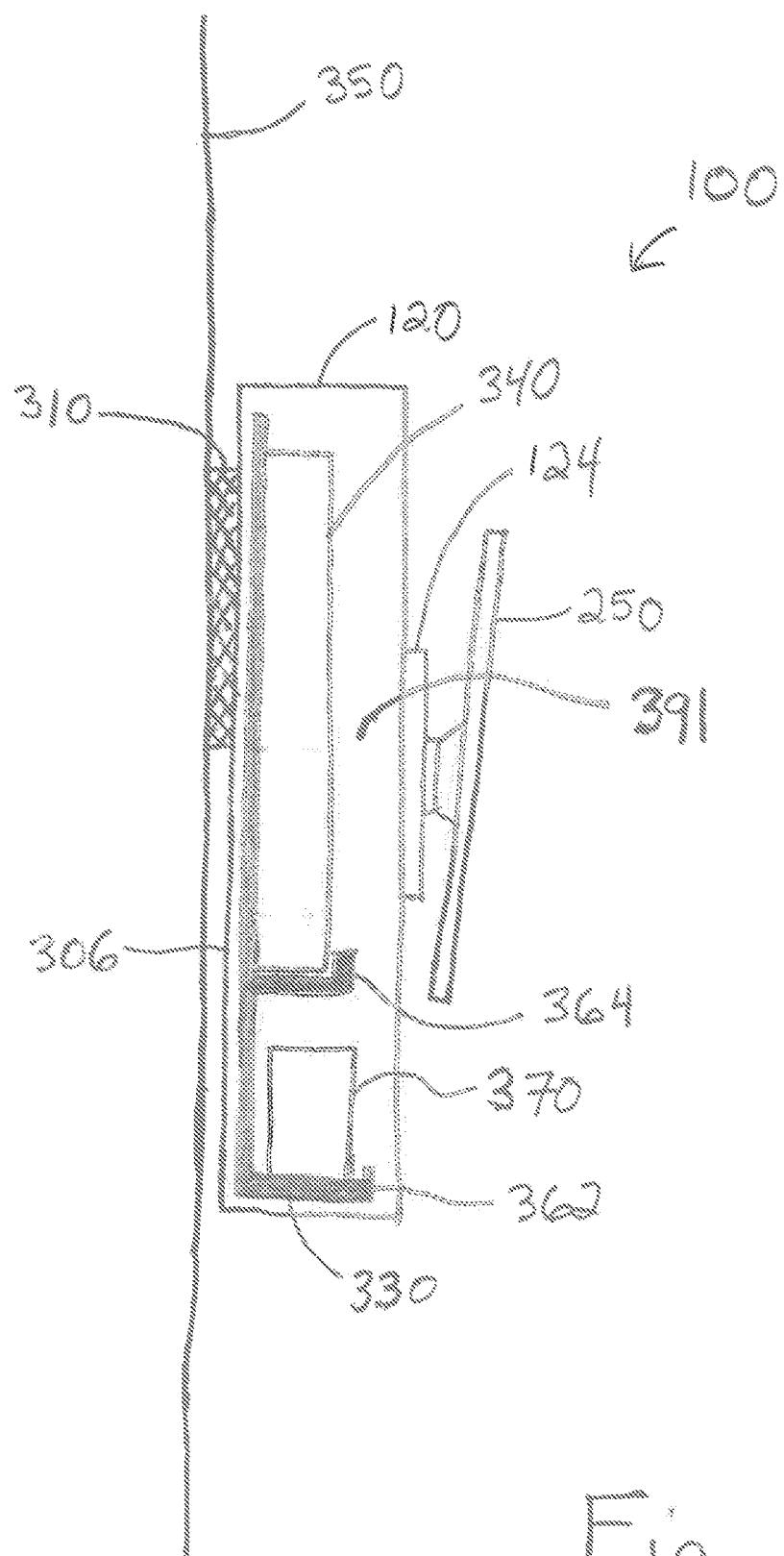
FIG. 3 shows a cross-section of a wall mountable enclosure in accordance with an embodiment.

FIG. 3 shows a cross-section of wall mountable enclosure 100 in accordance with an embodiment. Enclosure 100 includes back side 306, which together with sides 101, 102, 103, 104 define volume 391.

Enclosure 100 is mounted to a wall 350. Enclosure 100 includes a wall mount 310 and an inner slidable chassis 330. Wall mount 310 may include any suitable mounting means, for example, a commercially available mounting means. In one embodiment, wall mount 310 may be configured such that enclosure 120 is removably affixed to a wall, allowing for easy installation and removal.

In other embodiments, enclosure 120 may be floor mountable. In another embodiment, the front surface of outer enclosure 120 may include one or more additional cutouts to further facilitate the installation of a video screen thereon.

Slidable chassis 330 is disposed within volume 391. Slidable chassis 330 has a first, closed position (shown, for example, in FIG. 1) in which slidable chassis 330 is located entirely within volume 391 and a second, open position (shown in FIG. 6A, for example) in which all or a portion of slidable chassis 330 is pulled out of the enclosure 120 and therefore is located outside of volume 391.

Referring again to the illustrative embodiment of FIG. 3, slidable chassis 330 includes an upper compartment 364 and a lower compartment 362. An electronic device 340 is disposed in upper compartment 364 of slidable chassis 330. Electronic device 340 may be, for example, a consumer grade electronic device. An isolation transformer 370 is mounted in lower compartment 362 of slidable chassis 330. Isolation transformer 370 may be used to isolate the electronics housed within enclosure 120 from a power source and to reduce shock risk. The isolation transformer 370 may be mounted within the enclosure 120 in such a manner as to improve convective heat transfer within the enclosure.

In various embodiments, slidable chassis 330 may be affixed to outer enclosure 120 via any means of slidable fixation. In one embodiment, slidable chassis 330 is affixed to outer enclosure 120 via a slidable track such as cabinet slides. For example, the slidable track may be affixed to the bottom side or to the rear side of slidable chassis 330.

In one embodiment, slidable chassis 330 is joined to detachable side 130 (shown in FIGS. 1 and 2) of the outer enclosure. Therefore detachable side 130 moves with slidable chassis 330. Detachable side 130 is adapted to fit onto a side of outer enclosure 120, and serves to close outer enclosure 120 when slidable chassis 330 is in a closed position. When slidable chassis 330 is in the closed position, detachable side 130 is joined to sides 102, 103, 104 (shown in FIG. 1), and side 306 (shown in FIG. 3). Thus, when slidable chassis 330 is in the closed position, sides 101, 102, 103, 104, 130, and 306 are connected and define the boundaries of volume 391. For example, detachable side 130 may be flush with sides 102, 103, 104, and 306 of outer enclosure 120 when slidable chassis 330 is in the closed position. In one embodiment, detachable side 130 may include gaskets or the like to form an adequate seal for security and/or EMI shielding purposes.

Referring again to the illustrative embodiment of FIG. 1, detachable side 130 includes a locking mechanism 190. When locking mechanism 190 is locked, slidable chassis 330 cannot slide into its second, open, position. When locking mechanism 190 is unlocked, slidable chassis 330 can slide into its second, open, position.

Figure 4A:
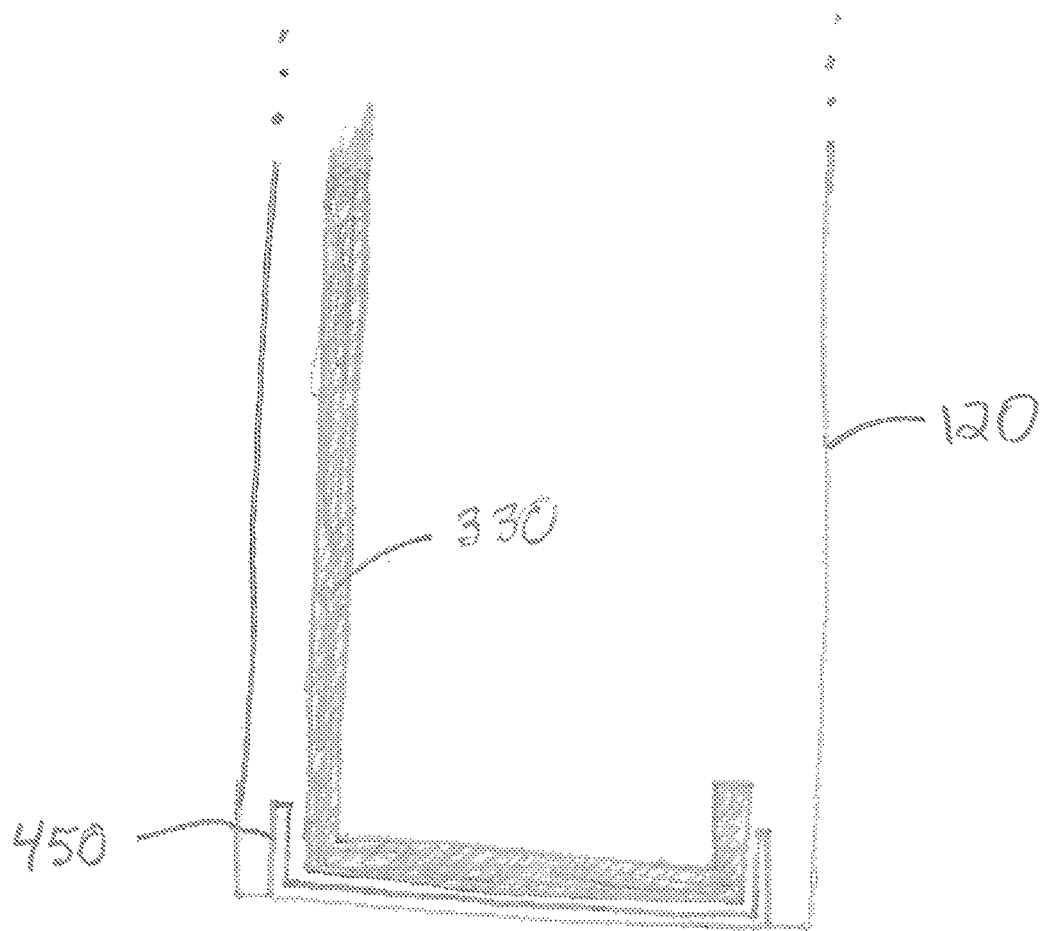
FIG. 4A shows a cross-section of a wall mountable enclosure in accordance with an embodiment.
Figure 4B:
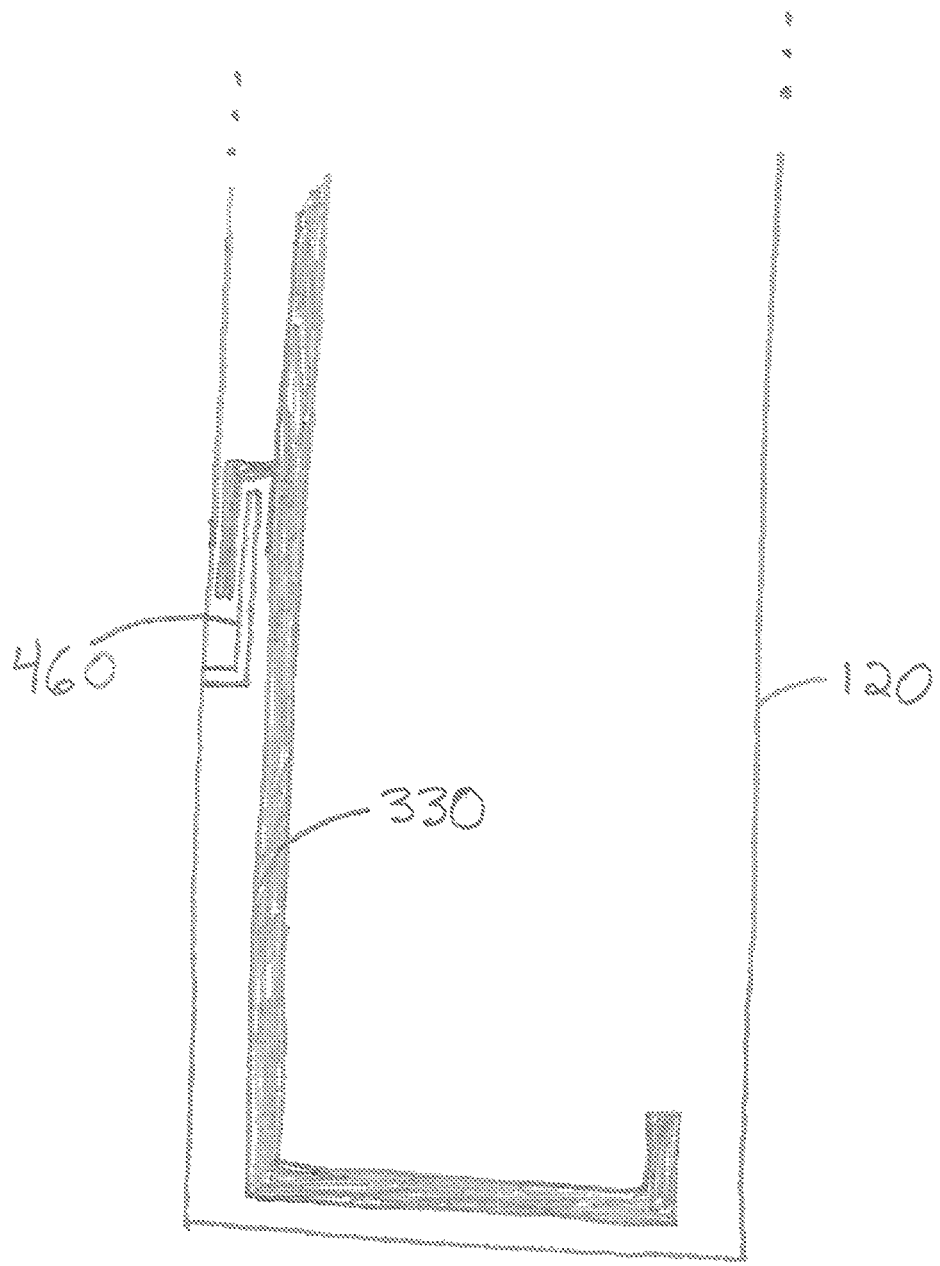
FIG. 4B shows a cross-section of a wall mountable enclosure in accordance with another embodiment.
Figure 4C:
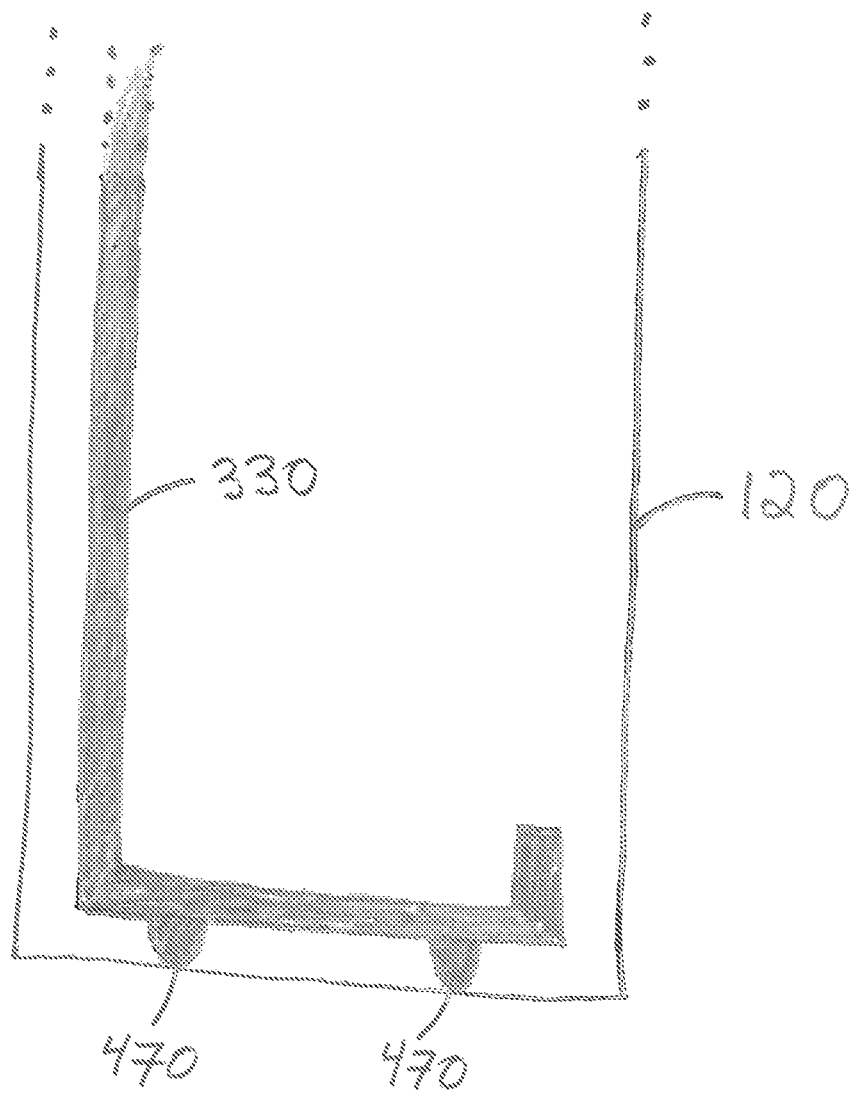
FIG. 4C shows a cross-section of a wall mountable enclosure in accordance with another embodiment.

In one embodiment, slidable chassis 330 may be disposed in, and slide within, a track. The track may be configured in any suitable manner. For example, FIG. 4A shows a cross-section of wall mountable enclosure 100 in accordance with an embodiment. A track 450 is disposed on interior surface of the bottom side of outer enclosure 120. Slidable chassis 330 is disposed in and slides within track 450. FIG. 4B shows a cross-section of wall mountable enclosure 100 in accordance with another embodiment. A track 460 is disposed on the interior surface of a side wall of outer enclosure 120. Slidable chassis 330 is disposed in and slides within track 460. FIG. 4C shows a cross-section of a wall mountable enclosure in accordance with another embodiment. A plurality of slides are disposed on the bottom of slidable chassis 330 and enable slidable chassis to move within enclosure 120. For example, cabinet slides may be used. In other embodiments, wheels, bearings, rollers, or other mechanisms may be used to enable slidable chassis 330 to move.

Figure 5:
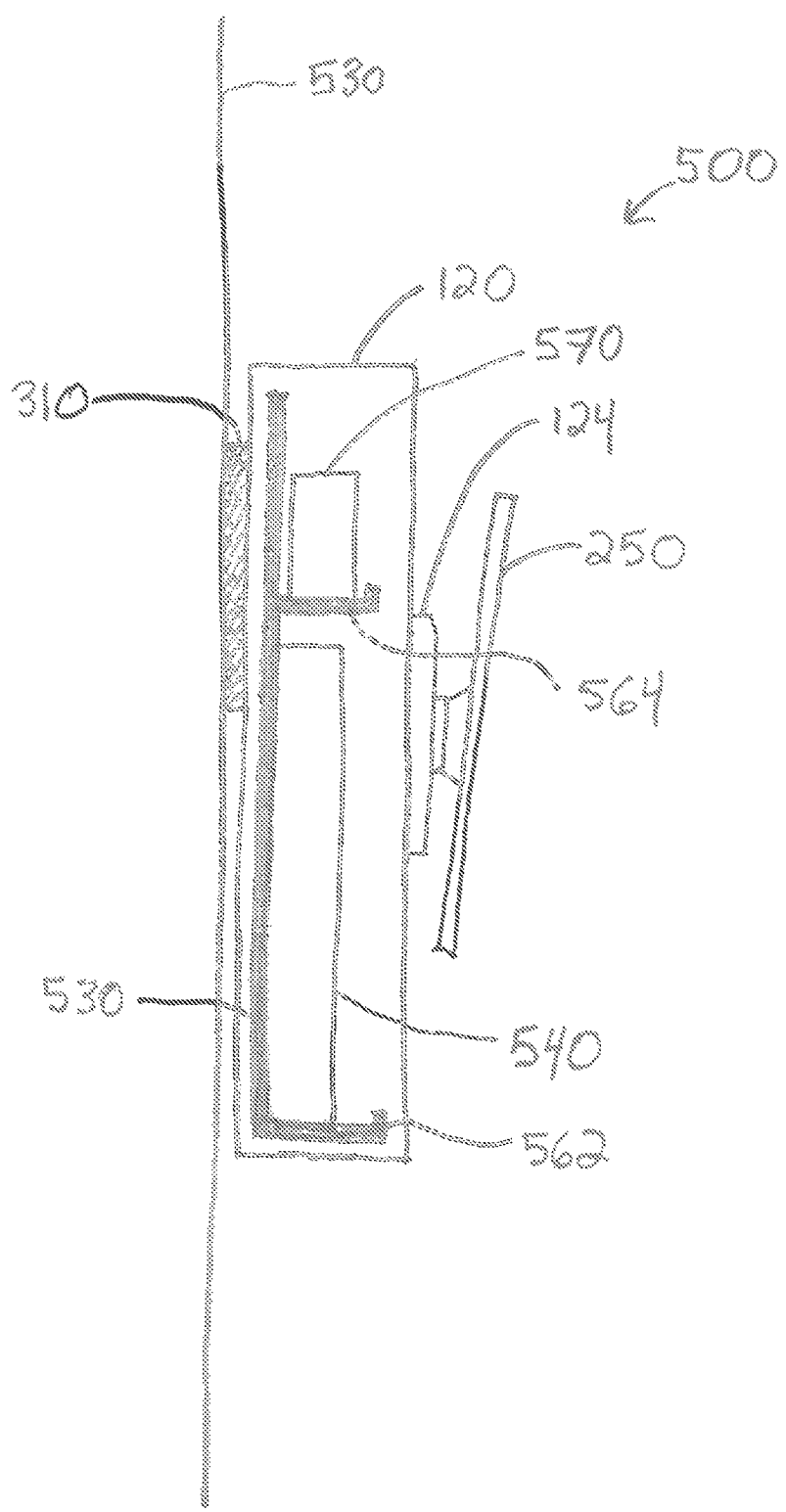
FIG. 5 shows a cross-section of a wall mountable enclosure mounted to a wall in accordance with another embodiment.

The slidable chassis within the wall mountable enclosure may be constructed in any suitable manner and have any number of compartments adapted to hold various electronic devices and/or other objects. For example, FIG. 5 shows a cross-section of a wall mountable enclosure 500 mounted to a wall 530 in accordance with another embodiment. Enclosure 500 includes wall mount 310, outer enclosure 120, and an inner slidable chassis 530. In the illustrative embodiment of FIG. 5, slidable chassis 530 includes an upper compartment 564 and a lower compartment 562. An electronic device 540 is disposed in lower compartment 562 of slidable chassis 530. An isolation transformer 570 is mounted in upper compartment 564 of slidable chassis 530. Video screen mount 124 and video screen 250 are mounted to outer enclosure 120.

As mentioned, the detachable side and the slidable chassis have a first, closed, position (shown, for example, in FIG. 1) and a second, open, position. FIG. 6A shows wall mountable enclosure 100 of the embodiment of FIG. 1 in an open position. Slidable chassis 330 is joined to detachable side 130. Slidable chassis 330 is adapted to move horizontally in the track (e.g., track 450 or 460) between the closed position shown in FIG. 1 and the open position shown in FIG. 6A. Thus, when a user wishes to access electronic device 340, the user may easily pull detachable side and slidable chassis 330 from the first, closed, position to the second, open position in order to access electronic device 340. When the user no longer needs to access the electronic device, the user may slide the detachable side 130 and slidable chassis 330 from the second, open, position, back to the first, closed, position. Thus, a user may move slidable chassis 330 between the open position and the closed position by manually pulling or pushing detachable side 130.

FIG. 6B shows wall mountable enclosure 500 of the embodiment of FIG. 5 in an open position. Slidable chassis 530 is joined to a detachable side 630. Slidable chassis 530 is adapted to move horizontally in the track between the first, closed, position and the second, open position. Thus, when a user wishes to access electronic device 540, the user may easily pull detachable side 630 and slidable chassis 530 from the first, closed, position to the second, open position in order to access electronic device 540. When the user no longer needs to access the electronic device, the user may slide the detachable side 630 and slidable chassis 530 from the second, open, position, back to the first, closed, position. Thus, a user may move slidable chassis 530 between the open position and the closed position by manually pulling or pushing detachable side 630.

In another embodiment, a slidable chassis may slide vertically up and down within an outer enclosure.

Figure 7:
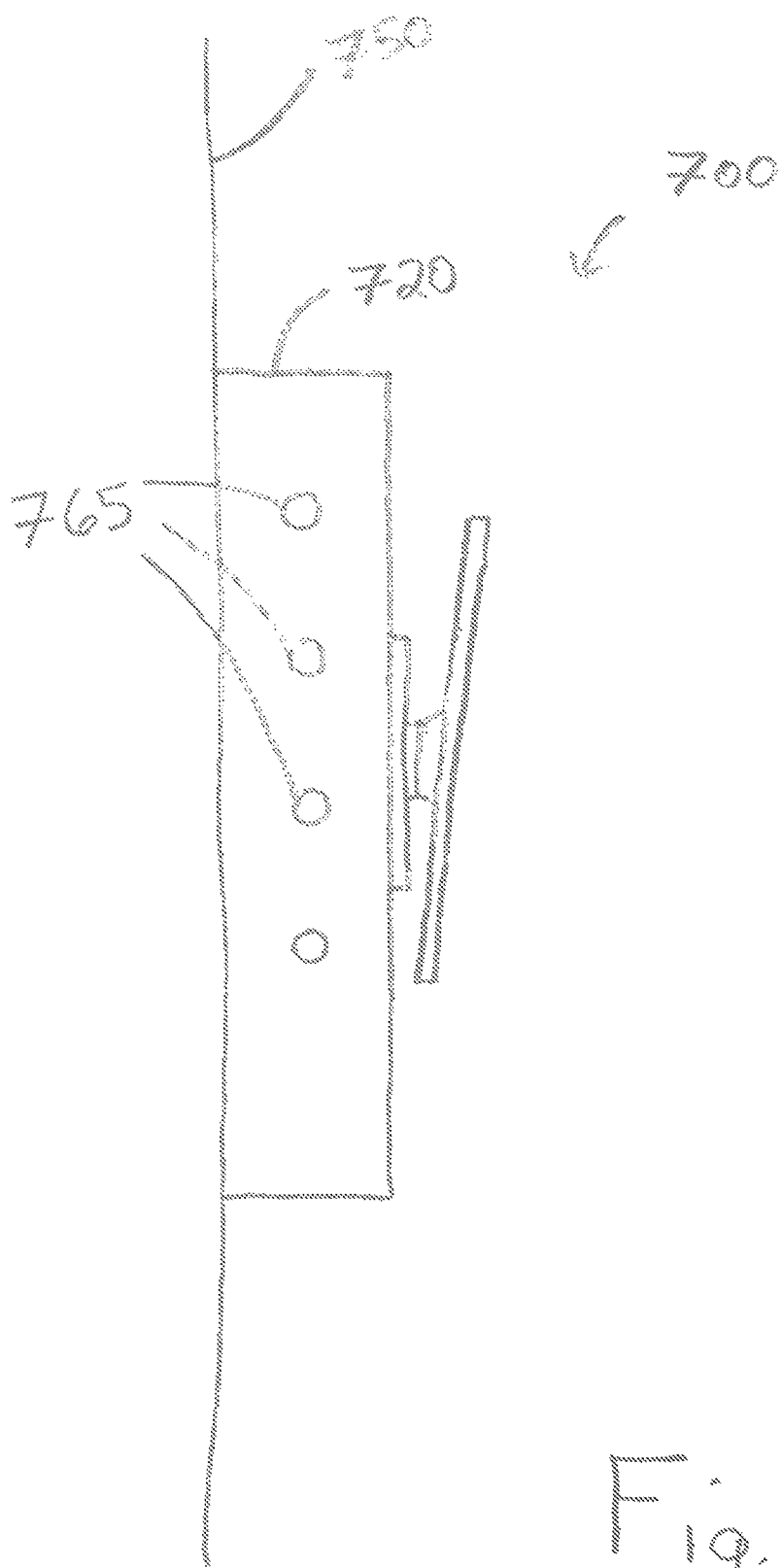
FIG. 7 shows a wall mountable enclosure mounted on a wall in accordance with another embodiment.

FIG. 7 shows a wall mountable enclosure 700 mounted on a wall 750 in accordance with another embodiment. Wall mountable enclosure 700 includes an outer enclosure 720. Outer enclosure 720 includes a plurality of cutouts (or holes) 765 on one or more sides of the enclosure. The cutouts 765 help to maintain a stable environment within enclosure 720 by dispersing heat created by the electronics housed within the enclosure, and by promoting convective heat transfer. In other embodiments, cutouts 765 may be disposed on the top side and/or the bottom side of enclosure 720. The cutouts 765 may also include EMI/RF shielding materials. For example, cutouts 765 may be partially or entirely covered by a selected material having EMI shielding properties, such as a metal screen or mesh.

Figure 8:
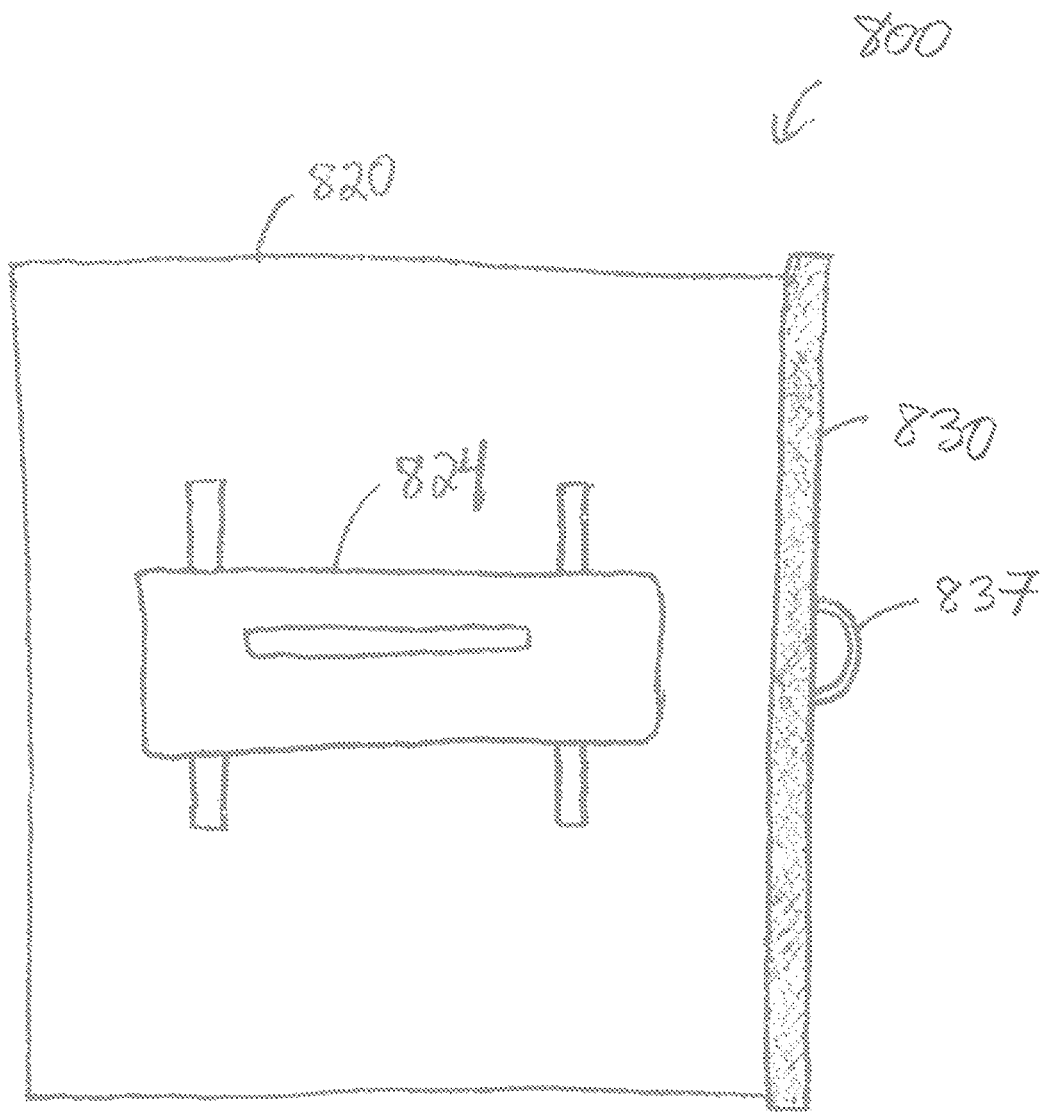
FIG. 8 shows a wall mountable enclosure in accordance with another embodiment.

FIG. 8 shows a wall mountable enclosure 800 in accordance with another embodiment. Wall mountable enclosure 800 includes an outer enclosure 820 and a video screen mount 824. A detachable right side 830 of the structure includes a handle 837, which facilitates the opening and closing of the apparatus.

In another embodiment, a wall mountable enclosure has a separate shielding layer to protect against outgoing (or incoming) emissions of electromagnetic frequencies. For example, FIG. 9 shows a cross-section of a wall mountable enclosure 900 mounted to a wall 930 in accordance with another embodiment. Enclosure 900 includes an outer enclosure 920, a wall mount 910, and an inner slidable chassis 930. An electronic device 940 is disposed in a lower compartment of slidable chassis 930. An isolation transformer 970 is mounted in an upper compartment of slidable chassis 930. A video screen mount 924 and a video screen 950 are mounted to outer enclosure 920. In the illustrative embodiment of FIG. 9, outer enclosure 920 is formed of a layer of a material that does not exhibit EMI shielding properties. For example, outer enclosure 920 may be formed of a material such as plastic. Other materials may be used. A shielding layer 905 is disposed on an interior of outer enclosure 920. For example, shielding layer 905 may be attached to the interior surface of outer enclosure 920. Shielding layer 905 may form an enclosed rectangular prism or cube, or other enclosed shape, within outer enclosure 920. Shielding layer 905 is formed of a material having EMI shielding properties. Thus, shielding layer 905 may be formed of any suitable EMI shielding material known in the art, such as a conductive or magnetic material to protect against outgoing (or incoming) emissions of electromagnetic frequencies. For example, shielding layer 905 may comprise, sheet metal, metal screen, metal foam, a coating of metallic ink, copper radio frequency (RF) shielding, copper foil, aluminum sheeting, conductive mesh, one or more magnets, etc. In one embodiment, shielding layer 905 may include one or more cutouts having sizes and shapes selected based on the wavelengths of electromagnetic radiation which the electronics housed within outer enclosure 920 are expected to emit, and/or the wavelengths to which the wall mountable enclosure 900 is expected to be exposed.

In one embodiment, a wall mountable enclosure similar to those described herein is adapted to store a telepresence system.

In accordance with another embodiment, a system includes a structure having a volume located inside the structure, wherein the structure comprises a layer formed of a material having EMI shielding properties. The system also includes a movable support having a first position in which the movable support is located within the volume and a second position in which at least a portion of the movable support is located outside the volume, and an electronic device disposed on the movable support, wherein the electronic device is located within the volume when the movable support is in the first position and at least part of the electronic device is located outside the volume when the movable support is in the second position. The structure is adapted to be mounted on a wall.

Advantageously, a consumer grade electronic device may be powered on and used for its ordinary purpose or function within a hospital room while the consumer grade electronic device is enclosed in the enclosure described herein. Due to the EMI shielding layer(s) of the enclosure, the enclosure qualifies as a medical grade electronic device while the consumer grade electronic device is turned on and functioning therein.

Thus, in accordance with another embodiment, an enclosure having a layer of an EMI shielding material is placed in a hospital room or in a room in a patient care facility. A consumer grade electronic device is placed in the enclosure. The consumer grade electronic device is operated in the hospital room. For example, the consumer grade electronic device is powered on and used for its ordinary purpose. Advantageously, the enclosure qualifies as a medical grade electronic device while the consumer grade electronic device is operating therein.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. An apparatus comprising:
   a structure having:
   a plurality of first sides, the plurality of first sides including a back side coupled to a wall, wherein the plurality of first sides define a volume, wherein the plurality of first sides comprise a first material having electromagnetic interference (EMI) shielding properties; and
   a second side detachably joined to the plurality of first sides, wherein the second side has a closed position in which the second side is joined to the plurality of first sides and an open position in which the side is detached from the plurality of sides, wherein the second side comprises a second material having EMI shielding properties; and
   a movable chassis coupled to the second side, the movable chassis comprising a first compartment holding an electronic device and a second compartment holding an isolation transformer, the movable chassis having a first chassis position in which the chassis is entirely within the volume and a second chassis position in which at least a portion of the chassis is outside the volume, wherein a movement of the chassis between the first chassis position and the second chassis position occurs in a direction parallel to the back side and parallel to the wall.

2. The apparatus of claim 1, further comprising:
   a track disposed within the structure;
   wherein the movable chassis is disposed in the track and moves along the track between the first chassis position and the second chassis position.

3. The apparatus of claim 1, wherein;
   the first material is one of: a sheet metal, a metal screen, a metal foam, a coating of metallic ink, a copper-based radio frequency (RF) shielding material, a copper foil, an aluminum sheeting, a conductive mesh, and one or more magnets; and
   the second material is one of: a sheet metal, a metal screen, a metal foam, a coating of metallic ink, a copper-based radio frequency (RF) shielding material, a copper foil, an aluminum sheeting, a conductive mesh, and one or more magnets.

4. The apparatus of claim 3, wherein the first material and the second material are the same.

5. The apparatus of claim 1, wherein the electronic device is accessible to a user when the movable chassis is in the second chassis position.

6. The method of claim 1, wherein the second side includes a locking mechanism that locks the second side in the closed position.

7. The method of claim 1, wherein the plurality of first sides comprise a first layer forming an outer enclosure and a second layer disposed on an interior of the outer enclosure, the second layer comprising one of: a sheet metal, a metal screen, a metal foam, a coating of metallic ink, a copper-based radio frequency (RF) shielding material, a copper foil, an aluminum sheeting, a conductive mesh, and one or more magnets.

8. A system comprising:
   a structure having a volume located inside the structure, wherein the structure comprises a layer formed of a material having electromagnetic interference (EMI) shielding properties; and
   a movable support comprising a first compartment holding an electronic device and a second compartment holding an isolation transformer, the movable support having a first position in which the movable support is located within the volume and a second position in which at least a portion of the movable support is located outside the volume;
   wherein the electronic device is located within the volume when the movable support is in the first position and at least part of the electronic device is located outside the volume when the movable support is in the second position;
   wherein the structure is mounted on a wall;
   wherein movement of the movable support between the first position and the second position occurs along a path that is parallel to the wall.

9. The system of claim 8, wherein the structure provides EMI shielding to people and objects proximate the structure by blocking electromagnetic frequencies emitted by the electronic device.

10. The system of claim 8, wherein the movable support comprises:
    a track; and
    a chassis that slides on the track.

11. The system of claim 8, wherein the material is one of: a sheet metal, a metal screen, a metal foam, a coating of metallic ink, a copper-based radio frequency (RF) shielding material, a copper foil, an aluminum sheeting, a conductive mesh, and one or more magnets.

12. The system of claim 8, wherein the structure comprises:
   a first layer of a first material that does not have electromagnetic interference (EMI) shielding properties; and
   a second layer of a second material having electromagnetic interference (EMI) shielding properties.

13. The system of claim 8, wherein the structure comprises:
   a plurality of first sides that define the volume; and
   a second side attached to the movable support, the second side having a closed position in which the plurality of first sides and the second side define boundaries of the volume and an open position in which the second side is not connected to the plurality of first sides.

14. The system of claim 13, wherein the second side further comprises a locking mechanism that locks the second side in the closed position.

15. A method comprising:
   placing, on a wall of a hospital room, an enclosure having a plurality of sides, each side having a respective layer of an EMI shielding material, wherein the enclosure further comprises a volume defined by the plurality of sides, and a movable chassis that fits in the volume, the movable chassis comprising a first compartment holding a consumer grade electronic device and a second compartment holding an isolation transformer, the movable chassis having a first chassis position in which the chassis is entirely within the volume and a second chassis position in which at least a portion of the chassis is outside the enclosure, wherein a movement of the chassis between the first chassis position and the second chassis position occurs in a direction parallel to the back side and parallel to the wall;
   and
   operating the consumer grade electronic device and the isolation transformer within the enclosure in the hospital room;
   wherein the enclosure qualifies as a medical grade electronic device while the consumer grade electronic device and the isolation transformer are operating therein.

* * * * *